United States Patent [19]
Kohdaka

[11] Patent Number: 5,153,454

[45] Date of Patent: Oct. 6, 1992

[54] CHOPPER TYPE COMPARATOR

[75] Inventor: Takayuki Kohdaka, Hamamatsu, Japan

[73] Assignee: Yamaha Corporation, Hammatsu, Japan

[21] Appl. No.: 652,289

[22] Filed: Feb. 7, 1991

[30] Foreign Application Priority Data

Feb. 7, 1990 [JP] Japan ................................. 2-27891
Feb. 7, 1990 [JP] Japan ................................. 2-27893

[51] Int. Cl.⁵ ....................... H03K 5/24; H03K 17/56
[52] U.S. Cl. ................................ 307/355; 307/240; 307/356
[58] Field of Search ..................... 207/240, 355, 356

[56] References Cited

U.S. PATENT DOCUMENTS 4,075,509  2/1978  Redfern ..................... 307/240 X
4,890,014  12/1989  Ramet ......................... 307/355

Primary Examiner—David Mis

Attorney, Agent, or Firm—Burns, Doane, Swecker & Mathis

[57] ABSTRACT

A chopper type comparator, for comparing a first analog input signal voltage and a second analog input signal voltage to each other, includes an input portion for inputting the first and second analog input signals, respectively, and selectively outputting the first and second analog input signals, and a comparison portion for providing a result of comparison of the first and second analog input signals. The comparison portion includes a capacitor connected to a selected output of the input means at one terminal of the capacitor, an inverter having an MOS FET and of which an input side thereof connected to the other terminal of the capacitor, a path connected in parallel between the input and an output of the inverter across a analog switch, a switch control portion for controlling an electrical connection state of the analog switch in response to selection of the output of the input portion, the analog switch having a suppressing portion for suppressing transmission of a voltage variation to the input side of the inverter from the output side thereof across the analog switch.

7 Claims, 3 Drawing Sheets

CHOPPER TYPE COMPARATOR

BACKGROUND OF THE INVENTION

1. Field of the Invention

The present invention relates to comparators, and in particular, to chopper type comparators.

2. Prior Art

Figure 1:
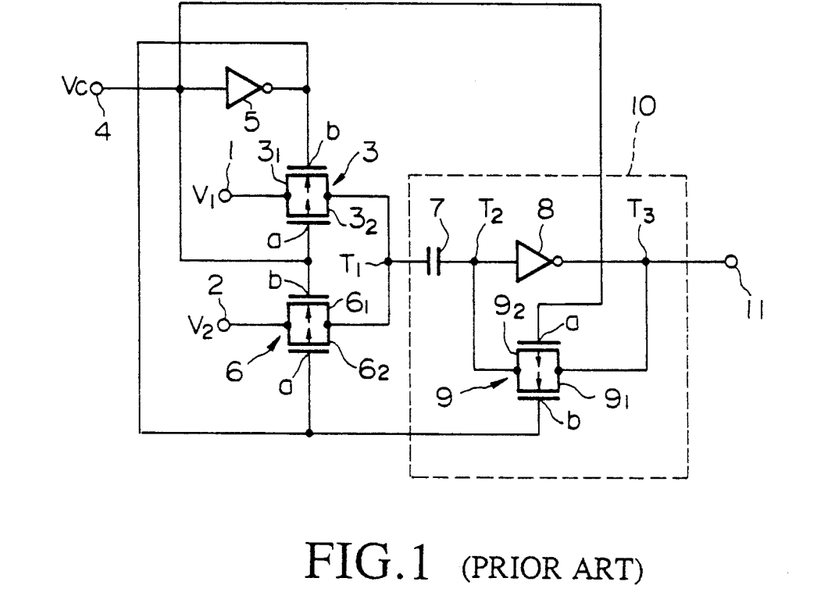
FIG. 1 is a circuit diagram showing the layout of a conventional chopper type comparator.

Chopper type comparators are conventionally known, for example, the circuit having a design such as that shown in FIG. 1. In the illustrated circuit, analog input voltage terminals 1 and 2 are provided, to each of which respective analog input voltage $V_1$ and $V_2$ are supplied. The analog input voltage terminal 1 connects to an analog switch 3 which is in turn made up of an N channel MOS (metal oxide semiconductor) transistor $3_1$ and a P channel MOS transistor $3_2$. The analog switch 3 is constructed such that when a gate a is low and a gate b is high in terms of the voltage levels applied thereto, current is conducted therethrough, whereas when the gate a is high and the gate b is low, current is not conducted.

A control input voltage terminal 4 is provided, to which a control input voltage $V_c$ is supplied. The control input voltage $V_c$ is inverted in an inverter 5. An analog switch 6 connects to the output terminal of the analog switch 3. The analog switch 6 is made up of an N channel MOS transistor $6_1$ and a P channel MOS transistor $6_2$, and is identical in structure and operation to the analog switch 3 described above.

One terminal of a capacitor 7 connects to the output terminals of the analog switch 3 and the analog switch 6 at a terminal $T_1$. The other terminal of the capacitor 7 connects to the input terminal of an inverter 8 and with one terminal of an analog switch 9 at a terminal $T_2$. As the analog switches 3 and 6, the analog switch 9 is made up of an N channel MOS transistor $9_1$ and a P channel MOS transistor $9_2$. Each of elements 7 through 9 described above together form a comparator unit 10. In certain implementations of the kind of the chopper type comparator shown in FIG. 1, the multiple comparator units 10 are incorporated and connected together thereby forming a multiple-stage comparator. An output terminal 11 for the comparator unit 10 and for the chopper type comparator as a whole is provided, which is connected to the output terminal of the inverter 8 as well as with the analog switch 9.

With the chopper type comparator as described above, the gate a of the analog switch 3 and that of the analog switch 9 and and the gate b of the analog switch 6 are all directly connected to the control input voltage terminal 4, whereas the gate b of the analog switch 3 and that of the analog switch 9 and the gate a of the analog switch 6 are all directly connected to the output of the inverter 5 wherein the control input voltage $V_c$ applied at the control input voltage terminal 4 is inverted. As a result, when the control input voltage $V_c$ applied at the control input voltage terminal 4 is low in terms of the voltage level applied thereto, the gate a of the analog switch 3 and that of the analog switch 9 and the gate b of the analog switch 6 are all in a low state and the gate b of the analog switch 3 and that of the analog switch 9 and the gate a of the analog switch 6 are all in a high state. Conversely, when the control input voltage $V_c$ applied at the control input voltage terminal 4 is high, the gate a of the analog switch 3 and that of the analog switch 9 and the gate b of the analog switch 6 are all in a high state and the gate b of the analog switch 3 and that of the analog switch 9 and the gate a of the analog switch 6 are all in a low state.

Because of the features described in the preceding paragraph, the analog switches 3 and 9 are always in the same state and the analog switch 6 is always in the opposite state compared with the analog switches 3 and 9. In other words, when the control input voltage $V_c$ applied at the control input voltage terminal 4 is low, the analog switch 6 is nonconductive and the analog switches 3 and 9 are conductive, whereas when the control input voltage $V_c$ applied at the control input voltage terminal 4 is high, the analog switch 6 is conductive and the analog switches 3 and 9 are nonconductive.

Accordingly, when the analog input voltages $V_1$ and $V_2$ are simultaneously applied to the analog input voltage terminals 1 and 2, respectively, and the control input voltage $V_c$ applied at the control input voltage terminal 4 is low, the analog input voltage $V_1$ is output from the analog switch 3 and applied to the capacitor 7 at the terminal $T_1$. The opposite terminal $T_2$ of the capacitor 7 is connected directly with one terminal of the analog switch 9, and with the other terminal of the analog switch 9 after being electronically inverted in the inverter 8. Because the analog switch 9 is conductive when the control input voltage Vc is low, a short circuit is effectively formed between the terminal $T_2$ and the terminal $T_3$.

The above mentioned inverter 8 consists of a CMOS (complementary metal oxide) circuit constructed in turn from complementary FETs (complementary field effect transistors). When the properties of the FETs incorporated in the CMOS circuit making up the inverter 8 are highly uniform, and when the control input voltage $V_c$ applied at the control input voltage terminal 4 is low, the voltage at the terminals $T_2$ and $T_3$ is one half of a supplied power source voltage $V_{DD}$ which is supplied to the inverter 8, in other words, the voltage between the terminals $T_2$ and $T_3$ is equal to $(\frac{1}{2}) \cdot V_{DD}$. Under these conditions, the potential difference across the capacitor 7 is equal to $(V1 - (\frac{1}{2}) \cdot V_{DD}$. In response to this potential difference across the capacitor 7, that is, in response to this potential difference between the terminals $T_1$ and $T_2$, an electrical charge is accumulated in the capacitor 7.

When the control input voltage $V_c$ applied at the control input voltage terminal 4 is then caused to jump to high, the gate a of the analog switch 3 and that of the analog switch 9 and the gate b of the analog switch 6 are then all in a high state and the gate b of the analog switch 3 and that of the analog switch 9 and the gate a of the analog switch 6 are all in a low state. Accordingly, the analog switch 6 becomes conductive and the analog switches 3 and 9 become nonconductive, for which reason the analog input voltage $V_2$ output from the analog switch 6 is applied to the capacitor 7 at the terminal $T_1$. Because the analog switch 9 is nonconductive and thus acts as an open circuit when the control input voltage $V_c$ is high, the opposite terminal $T_2$ of the capacitor 7 at the terminal $T_2$ is effectively connected only with the input terminal of the inverter 8, and the output terminal of the inverter 8 is effectively connected only with the output terminal 11.

Before the control input voltage $V_c$ applied at control input voltage terminal 4 was caused to jump to high, the potential difference across the capacitor 7 was equal to $V_1 - (\frac{1}{2}) \cdot V_{DD}$, thus the charge accumulated in the capacitor 7 was in response to a potential difference of $(V_1-(\frac{1}{2})\cdot V_{DD})$ thereacross. When the control input voltage $V_c$ jumps to high, and the voltage at the terminal $T_1$ therefore changes to $V_2$, the voltage at terminals $T_2$ then becomes to $(V_2-V_1+(\frac{1}{2})\cdot V_{DD})$.

Figure 2:
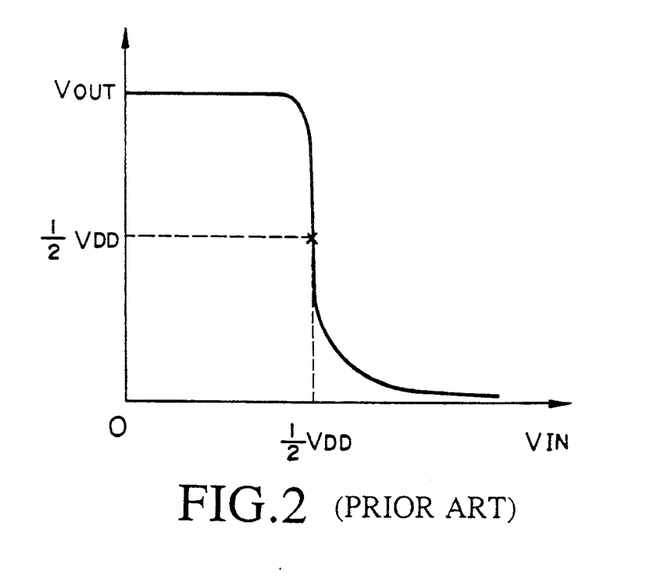
FIG. 2 is a graph which demonstrates the input-output characteristics of an inverter 8 which can be seen as a component of the conventional chopper type comparator shown in the circuit diagram of FIG. 1.

Referring to FIG. 2 which shows a graph of the characteristic curve of the output voltage $V_{out}$ of the inverter 8 as a function of the input voltage $V_{in}$ thereof, it can be seen that the slope is greatest when the analog switch 9 is in the conducting state, that is, when the inverter 8 is connected as a short circuit. For this reason, when the input voltage $V_{in}$ is in the vicinity of $(\frac{1}{2})\cdot V_{DD}$, small changes in the magnitude thereof result in large changes in the output voltage $V_{out}$. In consideration of these characteristics, it can be seen that when $V_2 > V_1$, the output voltage level at the terminal $T_3$ of the inverter 8 will be low, whereas when $V_1 > V_2$, that of the terminal $T_3$ will be high. Based on these characteristics, comparison of the magnitude of the voltage $V_1$ relative to the magnitude of the voltage $V_2$ can be carried out. By connecting a plural of the comparator units 10 such as multiple stages, the overall gain of the chopper type comparator can be increased.

With this type of conventional chopper type comparator, when the analog switch 9 is turned on or off, in particular, when analog switch 9 transits from a conducting state to a nonconducting state, spike noise is mixed with the analog input voltage through the gate electrostatic capacitance, and is thereby made to introduce the spike noise. Thus, the potential at terminal $T_2$ deviates from $(\frac{1}{2})\cdot V_{DD}$ by a voltage variation $\Delta V_A$.

Furthermore, with this kind of chopper type comparator, when the potential at the terminal $T_3$ at the output lead of the inverter 8 changes from $(\frac{1}{2})\cdot V_{DD}$ to high, or from $(\frac{1}{2})\cdot V_{DD}$ to low, via junction capacitance in the analog switch 9, the change in potential at the terminal $T_3$ leads to a change of potential at the terminal $T_2$ by the voltage variation $\Delta V_A$.

When the above described voltage variation $\Delta V_A$ is greater than $V_2 - V_1$, it becomes impossible to compare the potential of $T_3$ and $T_2$. For this reason, it is important to minimize the magnitude of any voltage variation $\Delta V_A$ so as to provide sufficiently accurate comparator operation. By selecting the capacitor 7 such that the capacitance thereof is relatively large relative to the charge of the gate electrostatic capacitance and the junction capacitance of the analog switch 9, the magnitude of the voltage variation $\Delta V_A$ can be diminished. Herein, the junction capacitance of the analog switch 9 is defined as four parts; that is, a PN junction capacitance which exists between a source and a substrate in P channel; a PN junction capacitance which exists between a drain and a substrate in P channel; a PN junction capacitance which exists between a source and a substrate in N channel and a PN junction capacitance which exists between a drain and a substrate in an N channel.

Thus, by increasing the capacitance of the capacitor 7 in the type of the conventional chopper type comparator shown in FIG. 1, the accuracy thereof was improved. Increasing the capacitance of the capacitor 7, however, has the effect of prolonging the time required for charging and discharging the capacitor 7, thereby leading to a marked loss in ability to carry out high speed comparisons which is decidedly undesirable.

SUMMARY OF THE INVENTION

In consideration of the above, it is an object of the present invention to provide a chopper type comparator which is capable of carrying out highly accurate comparisons with an extremely rapid response.

So as to achieve the above stated object, the present invention provides a chopper type comparator for comparing voltage of a first analog input signal and voltage of a second analog input signal each other, comprising: input means for inputting the first and second analog input signals respectively and selectively outputting the first and second analog input signals; comparison means for providing a result of comparison of the first and second analog input signals, comprising, a capacitor connected to a selected output of the input means at one terminal of the capacitor, an inverter having an MOS field effect transistor and of which an input side thereof connected to the other terminal of the capacitor, a path connected in parallel between the input and an output of inverter across a analog switch, switch control means for controlling an electrical connection state of the analog switch in response to selection of the output of the input means, the analog switch having a suppressing means for suppressing transmission of a voltage variation to the input side of the inverter from the output side thereof across the analog switch, wherein the analog switch further comprises a circuit capable of suppressing spike noise when the analog switch opens and closes.

With this device, through opening and closing operation of the above described first, second and multiple serially connected third analog switches, the first analog input voltage which is applied to the first analog switch and the second analog input voltage which is applied to the second analog switch are compared, and a comparison voltage is output. With this chopper type comparator, when the multiple serially connected third analog switches close, an electrical connection is created between the input and output terminals of the above mentioned inverter, thus effectively creating a short circuit across the inverter. When the multiple serially connected third analog switches open, the potential at each interconnection point between two adjacent third analog switches is equal to the potential when the input and output terminals of the above mentioned CMOS inverter are connected to one another, whereby variation of the potential at the output terminal of the inverter has no effect on the potential at the input terminal of the thereof.

DETAILED DESCRIPTION OF THE PREFERRED EMBODIMENTS

Figure 3:
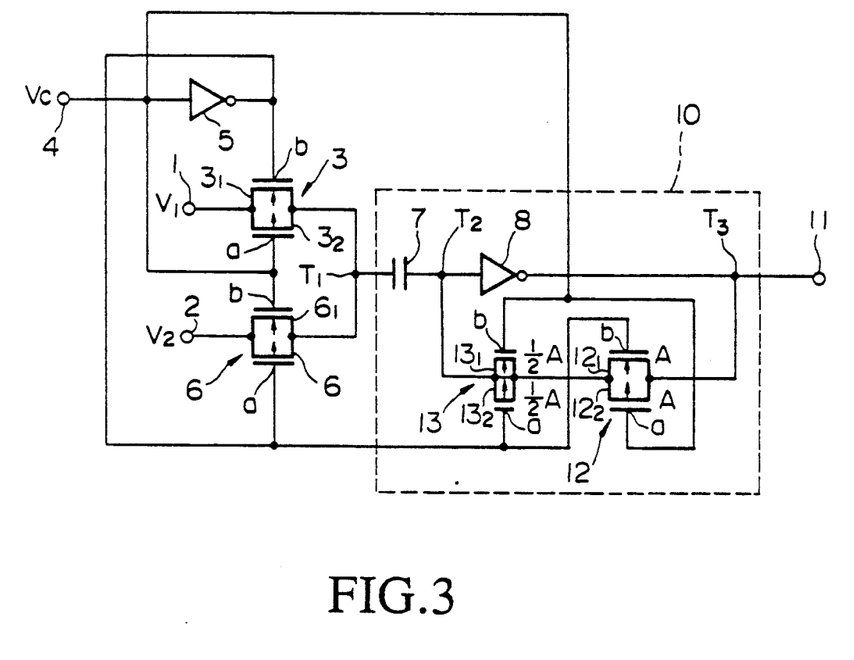
FIG. 3 is a circuit diagram showing the layout of a chopper type comparator of a first preferred embodiment of the present invention.

In the following, a chopper type comparator of the first preferred embodiment of the present invention will be described with reference to FIG. 3. In FIG. 3, components which correspond to components in the conventional circuit shown in FIG. 1 will retain the original identifying numeral, and their description will not be repeated.

As the diagram shows, analog switch 12 and 13 are provided to be connected in series with respect to each another, and together, are arranged in parallel with CMOS inverter 8. An analog switch 12 is a MOS semiconductor and is made up of a transistor $12_1$ and transistor $12_2$. Each of transistor $12_1$ and transistor $12_2$ is an N channel type and a P channel type, and each has an identical gate surface area A. On the other hand, conventional analog switches, that is, the analog switch switches 3, 6, and 9 are designed such that the resistance of P channel type transistor in conducting is equal to that of N channel type transistor, so that P channel type transistor is made physically larger than N channel type transistor because the mobility of the electrical charge in P channel type transistor is different from that of N channel type transistor. Thus, the gate surface areas of the conventional transistors are not equal to each other. The gate a of the analog switch 12 is connected to the control voltage input terminal 4 and the gate b is connected to the output terminal of the inverter 5. The input terminal of the analog switch 12 connects to the output terminal of an analog switch 13, and the output terminal of the analog switch 12 connects to the output terminal of the inverter 8 at the terminal $T_3$.

The analog switch 13 is also an MOS semiconductor and is made up of a transistor $13_1$ and a transistor $13_2$, each of which comprises an N channel type and a P channel type, and an identical gate surface area which is one half of the gate surface area of transistor $12_1$ and transistor $12_2$. The gate a of the analog switch 13 is connected to the gate b of the analog switch 12, and the gate b of the analog switch 13 is connected to the gate a of the analog switch 12. The input terminal of analog switch 13 is connected to the input terminal of the inverter 8 and to the terminal $T_2$ of the capacitor 7. Additionally, the input and output terminals of the analog switch 13 are connected together, thereby forming a short circuit.

Through the above described construction, when a first and second analog input voltage $V_1$ and $V_2$ are simultaneously supplied to the analog input voltage terminal 1 and the analog input voltage terminal 2, respectively, and a control voltage $V_c$ which is low is applied to the control voltage input terminal 4, the gate a of the analog switch 3, the gate b of the analog switch 6, the gate a of the analog switch 12 and the gate b of the analog switch 13 are each in a low state. Since the output terminal of the inverter 5 is high under these circumstances, the gate b of the analog switch 3, the gate a of the analog switch 6, the gate b of the analog switch 12 and the gate a of the analog switch 13 are each in a high state. Accordingly, the analog switches 3 and 12 is in a conductive state, and analog switch 6 are each in a nonconductive state.

With the device of the present invention, because the gate surface area of the N channel and the gate surface area of the P channel of the analog switch 12 both have areas A, the magnitude of the spike noise which penetrates the electrostatic capacitance is smaller than the conventional type when analog switch 12 is in a conductive state. Due to the fact that the analog switch 13 is incorporated into the device of the present invention, residual noise due to differing junction capacitance is extremely small. By virtue of the fact that the analog switch 13 is on/off, the spike noise $\Delta V_A$ generated by the analog switch 12 is deleted by using the noise, having reverse polarity to the spike noise $\Delta V_A$, which is generated by the analog switch 13, because the voltage applied to the gate of the analog switch 12 is the reverse of that to the analog switch 13.

Since the analog switch 3 is in a conductive state, the analog input voltage $V_1$ is output from the analog switch 3 and applied to the capacitor 7 at the terminal $T_1$. The opposite terminal of the capacitor 7 at the terminal $T_2$ connects directly with one terminal of the analog switch 12, and with the other terminal of the analog switch 12 through the inverter 8. Since the analog switch 12 is conductive when the control input voltage $V_c$ is low, a short circuit is effectively formed between the terminal $T_2$ and the terminal $T_3$.

Accordingly, the voltage between terminals $T_2$ and $T_3$ is one half of a supplied power source voltage $V_{DD}$, in other words, the voltage between terminals $T_2$ and $T_3$ is equal to $(\frac{1}{2}) \cdot V_{DD}$. Under these conditions, the spike noise is extremely small and no voltage variation $\Delta V_A$ develops. With the circuit as thus described, the potential difference across the capacitor 7 is equal to $(V_1 - (\frac{1}{2}) \cdot V_{DD})$. In response to this potential difference across the capacitor 7, that is, in response to this potential difference across terminals $T_1$ and $T_2$, a corresponding electrical charge is accumulated in the capacitor 7.

When the control input voltage $V_c$ applied at control input voltage terminal 4 is then caused to jump to high, the gate a of the analog switch 3 and that of the analog switch 12 and the gate b of the analog switch 6 and that of the analog switch 13 are then all in a high state. Because the output of the inverter 5 is low, the gate b of the analog switch 3 and that of the analog switch 12 and the gate a of the analog switch 6 and that of the analog switch 13 are all in a low state. Accordingly, the analog switches 6 and 13 become conductive and the analog switches 3 and 12 become nonconductive.

With the device of the present invention, because the gate surface area of the N channel and the gate surface area of the P channel of the analog switch 12 both have area A/2, the magnitude of the spike noise which penetrates the electrostatic capacitance is smaller than the conventional type when analog switch 13 is in a conductive state. Due to the fact that the analog switch 13 is incorporated into the device of the present invention, residual noise due to differing junction capacitance is extremely small.

Since the analog switch 6 is in a conductive state, the analog input voltage $V_2$ is output from the analog switch 6 and applied to the capacitor 7 at the terminal $T_1$. In this state, the potential difference across the capacitor 7 is equal to $(V_1 - (\frac{1}{2}) \cdot V_{DD})$. In response to this potential difference across the capacitor 7, that is, in response to this potential difference across terminals $T_1$ and $T_2$, a corresponding electrical charge is accumulated in the capacitor 7. Accordingly, the lead of the capacitor 7 at the terminal $T_2$ has a potential which varies from $(\frac{1}{2}) \cdot V_{DD}$ to $(V_2 - V_1 + (\frac{1}{2}) \cdot V_{DD})$.

In consideration of these characteristics, it can be seen that when $V_2 > V_1$, the terminal $T_3$ at the output lead of the inverter 8 will be low, whereas when $V_1 > V_2$, the terminal $T_3$ will be high. Based on these characteristics, comparison of the magnitude of voltage $V_1$ relative to the magnitude of voltage $V_2$ can be carried out. With this type of chopper type comparator, due to the fact that the analog switch 12 and the analog switch 13 are provided, when the analog switch 12 opens or closes, the amount of spike noise generated is exceedingly small. As a result, not only is the rate at which comparison operations can be carried out improved, but furthermore, a capacitor having relatively low capacitance can be employed for the capacitor 7 for which reason comparison accuracy can be considerably improved.

In this first preferred embodiment of the present invention as thus described, the analog switch 12 is an MOS and is made up of a transistor $12_1$ and transistor $12_2$, each of which has an N channel and P channel, and an identical gate surface area A, whereas the analog switch 13 is an MOS semiconductor and is made up of a transistor $13_1$ and transistor $13_2$, each of which has an N channel and P channel, and an identical gate surface area ½A which is one half of the gate surface area of transistors $12_1$ and transistor $12_2$. As long as a circuit for suppressing the spike noise generated by the opening and closing of the analog switch 12 is included, however, the configuration of the analog switch 12 and that of the analog switch 13 are interchangeable. It is possible to use the circuit which is disclosed by present inventor in Japanese Patent Application Laid-Open No. Heisei 2-67817 etc., for example, as the circuit described above.

Figure 4:
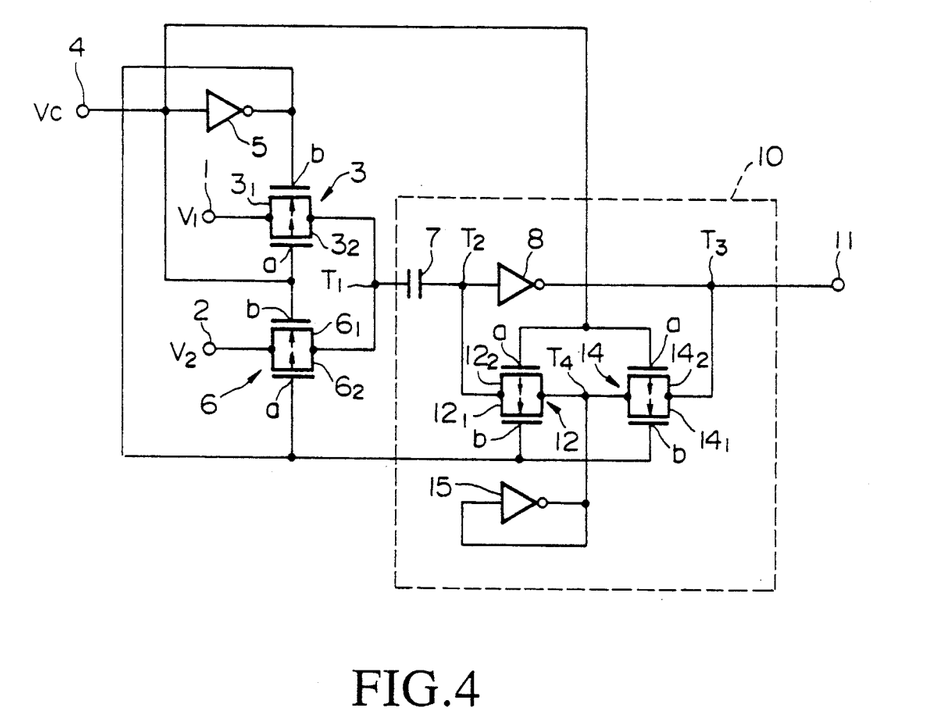
FIG. 4 is a circuit diagram showin the layout of a chopper type comparator of a second preferred embodiment of the present invention.

In the following, a chopper type comparator of the second preferred embodiment of the present invention will be described with reference to FIG. 4. In FIG. 4, components which correspond to components in the chopper type comparator of the first preferred embodiment of the present invention shown in FIG. 3 will retain the original identifying numeral, and their description will be abbreviated. Comparing the device of this second preferred embodiment with the device of the first preferred embodiment, it can be seen that the analog switch 13 is replaced by an analog switch 14 and an inverter 15.

The analog switch 14 is a MOS semiconductor and is made up of a transistor $14_1$ and transistor $14_2$. A gate a of the analog switch 14 is connected to the control voltage input terminal 4 and the gate b connects to the output terminal of the inverter 5. The input terminal of the analog switch 14 connects to the output terminal of the analog switch 12 at the terminal $T_4$, and the output terminal of the analog switch 14 connects to the output terminal of the inverter 8 at the terminal $T_3$.

At the terminal $T_4$ where the output terminal of the analog switch 12 connects to the input terminal of the analog switch 14, a CMOS fabricated inverter 15 is also connected. As FIG. 4 shows, the input and output terminals of the inverter 15 are connected together to form a short circuit across the device. The characteristics of this inverter 15 are identical to those of the inverter 8 which was described earlier.

As FIG. 4 shows, a first analog input voltage $V_1$ is supplied to the analog input voltage terminal 1 which connects directly with the analog switch 3, and a control voltage $V_c$ is applied to the control voltage input terminal 4 which connects to the inverter 5. When the control voltage $V_c$ which is low is applied to the control voltage input terminal 4, the gate a of the analog switch 3, the gate b of the analog switch 6, the gate a of the analog switch 12 and the gate a of the analog switch 14 are all in a low state. Since the output terminal of the inverter 5 is high under these circumstances, the gate b of the analog switch 3, the gate a of the analog switch 6, the gate b of the analog switch 12 and the gate b of the analog switch 14 are all in a high state. Accordingly, the analog switch 3, 12 and 14 are all in a conductive state, and the analog switch 6 is in a nonconductive state.

As a result, when a first and second analog input voltage $V_1$ and $V_2$ are simultaneously supplied to the analog input voltage terminal 1 and the analog input voltage terminal 2, respectively, and a control voltage $V_c$ which is low is applied to the control voltage input terminal 4, since the analog switch 3 is in a conductive state, the analog input voltage $V_1$ is output from the analog switch 3 and applied to the capacitor 7 at the terminal $T_1$. A short circuit is effectively formed across the input terminal of the inverter 8 which connects to the opposite terminal of the capacitor 7 at the terminal $T_2$ and the output terminal of the inverter 8 at the terminal $T_3$ since the analog switch 12 and the analog switch 14 are both open in this state.

Accordingly, the voltage between terminals $T_2$ and $T_3$ is one half of a supplied power source voltage $V_{DD}$, in other words, the voltage between terminals $T_2$ and $T_3$ is equal to $(½) \cdot V_{DD}$. With the circuit as thus described, the potential difference across the capacitor 7 is equal to $(V_1 - (½) \cdot V_{DD})$. In response to this potential difference across the capacitor 7, that is, in response to this potential difference across terminals $T_1$ and $T_2$, a corresponding electrical charge is accumulated in the capacitor 7.

When the control input voltage $V_c$ applied at the control input voltage terminal 4 is then caused to jump to high, the gate a of the analog switch 3 and those of the analog switch 12 and the analog switch 14 and the gate b of the analog switch 6 are all in a high state. Because the output of the inverter 5 is low, the gate b of the analog switch 3 and those of the analog switch 12 and the analog switch 14 and the gate a of the analog switch 6 are all in a low state. Accordingly, the analog switch 6 is conductive and the analog switches 3, 12 and 14 are nonconductive.

Since the analog switch 6 is in a conductive state, analog input voltage $V_2$ is output from the analog switch 6 and applied to the capacitor 7 at the terminal $T_1$. At this time, the initial potential difference across the capacitor 7 is equal to $(V_1 - (½) \cdot V_{DD})$, in response to which a corresponding electrical charge is accumulated in the capacitor 7. Accordingly, the lead of the capacitor 7 at the terminal $T_2$ has a potential which varies from $(½) \cdot V_{DD}$ to $(V_2 - V_1 + (½) \cdot V_{DD})$.

In consideration of these characteristics, it can be seen that when $V_2 > V_1$, the terminal $T_3$ at the output lead of the inverter 8 will be low, whereas when $V_1 > V_2$, the terminal $T_3$ will be high (as shown in FIG. 2). At the terminal $T_4$ where the analog switch 12 and the analog switch 14 are interconnected, because the inverter 15 which has its input and output leads shorted is also connected to the terminal $T_4$, the potential at this point is ½$V_{DD}$. As a result, variation of potential at output terminal $T_3$ of inverter 8 has no effect on the potential at the input terminal $T_2$ of inverter 8, whereby the generation of noise is prevented. In other words, in order to suppress the transmitting in which the effect of a voltage variation caused by voltage applied to the terminal $T_3$ in off-timing of the analog switch 12 is not transmitted to the side of the terminal $T_2$, the input side of the inverter 15 from the output side thereof across the analog switch 12, that is, a potential at the terminal $T_4$ is required to hold the constant potential which is equal to $(\frac{1}{2}) \cdot V_{DD}$. Thus, the analog switch 12 is connected to the analog switch 14 in series, so that the analog switch 12 and the analog switch 14 are both in on-timing, thereby being in the short state, while in off-timing the potential of the terminal $T_4$ becomes $(\frac{1}{2}) \cdot V_{DD}$, the analog switch 14 is off and separates from the terminal $T_3$ and the terminal $T_4$.

Through the above described operations, the analog input voltages $V_1$ and $V_2$ can be compared. As thus described, the analog switch 12 and the analog switch 14 are connected in series, and the serially connected the analog switches 12 and 14 are together connected in parallel with the inverter 8. Because the inverter 15 with its input and output leads shorted is connected to the terminal $T_4$ where the analog switches 12 and 14 are interconnected, the potential at this point is $(\frac{1}{2}) \cdot V_{DD}$, and generation of spike noise by the opening or closing operation of the analog switch 12 is prevented. Accordingly, rapid comparison operations are possible, and a capacitor having low capacitance can be used for the capacitor 7, thereby permitting further improvements in speed and accuracy.

Although only the two analog switches, the analog switches 12 and 14 were connected in series, and together connected in parallel with the inverter 8, more than two analog switches can be serially connected, together in a parallel arrangement with the inverter 8. Further, although the inverter 15 was connected to the interconnection of the analog switches 12 and 14 at the terminal $T_4$ so as to achieve a potential at this point of $(\frac{1}{2}) \cdot V_{DD}$, other types of circuits and components can be used in place of the inverter 15 if they cause the potential at the terminal $T_4$ to equal that at the input terminal of the inverter 8 at the terminal $T_2$.

What is claimed is:

1. A chopper type comparator for comparing voltage of a first analog input signal and voltage of a second analog input signal to each other, comprising:
   input means for inputting the first and second analog input signals respectively and selectively outputting the first and second analog input signals;
   comparison means for providing a result of comparison of the first and second analog input signals, further comprising,
   a capacitor connected to a selected output of said input means at one terminal of the capacitor,
   an inverter having an MOS field effect transistor and of which an input side is connected to the other terminal of the capacitor,
   a path connected in parallel between the input side of the inverter and an output side of the inverter across an analog switch, and
   switch control means for controlling an electrical connection state of the analog switch in response to selection of the output of the input means,
   the analog switch having a suppressing means for suppressing transmission of a voltage variation to the input side of the inverter from the output side thereof across the analog switch.

2. A chopper type comparator in accordance with claim 1 wherein said analog switch comprises an MOS field effect transistor further comprising an N channel transistor and a P channel transistor, the gate surface area of said N channel transistor being equal to the gate surface area of said P channel transistor.

3. A chopper type comparator in accordance with claim 2 further comprising:
   a second analog switch comprising an N channel transistor and a P channel transistor, the gate surface area of the N channel transistor and the P channel transistor of the second analog switch being smaller than the gate surface area of the N channel transistor and the P channel transistor of said analog switch, said second analog switch being connected to said analog switch in series.

4. A chopper type comparator in accordance with claim 1 wherein said analog switch further comprises:
   two MOS field effect transistors, connected to each other in series; and
   a voltage holding portion for holding a potential at an interconnection point connected to the voltage holding portion equal to the potential at said interconnection point when input and output terminals of said inverter are short circuited.

5. A chopper type comparator comprising:
   a first analog switch to which a first analog input voltage is supplied;
   a second analog switch to which a second analog input voltage is supplied, said second analog switch having an output terminal which is connected to an output terminal of said first analog switch;
   a capacitor with a first terminal connected to the output terminals of said first and second analog switches;
   a CMOS fabricated inverter with an input terminal connected to a second terminal of said capacitor; and
   a third analog switch connected in parallel with said inverter, said third analog switch comprising a circuit capable of suppressing spike noise when said third analog switch opens and closes, said third analog switch and said inverter together comprising a comparator unit, wherein said first and second analog input voltages are compared to each other, and a comparison voltage is output from said chopper type comparator; and
   wherein said third analog switch further comprises:
   a fourth analog switch comprising MOS field effect transistors, wherein said MOS field effect transistors are an N channel transistor and a P channel transistor, the gate surface area of said N channel transistor being equal to the gate surface area of said P channel transistor; and
   a fifth analog switch comprising MOS field effect transistors, wherein said MOS field effect transistors are an N channel transistor and a P channel transistor, the gate surface area of said N channel of said fifth analog switch being equal to the gate surface area of said P channel of said fifth analog switch, and the gate surface area of said N channel and said P channel of said fifth analog switch each being equal to one-half the gate surface area of each of said N channel and said P channel of said fourth analog switch.

6. A chopper type comparator comprising:
   a) a first analog switch to which a first analog input voltage is supplied;
   b) a second analog switch to which a second analog input voltage is supplied, said second analog switch having an output terminal which is connected to an output terminal of said first analog switch;

c) a capacitor with a first terminal connected to the output terminals of said first and second analog switches;
d) a CMOS fabricated inverter having an input terminal connected to a second terminal of said capacitor;
e) multiple third analog switches arranged so as to be connected in series with respect to one another thereby forming a chain of serially connected analog switches, said chain of serially connected analog switches as a whole being connected in parallel with said inverter; and
f) at least one circuit for holding the potential at each interconnection point between two adjacent third analog switches in said chain of serially connected analog switches equal to the potential at said interconnection point when the input and output terminals of said inverter are short circuited, whereby said first and second analog input voltages are compared, and a comparison voltage is output from said chopper type comparator.

7. A chopper type comparator in accordance with claim 6, wherein each instance of said at least one circuit for holding the potential at each interconnection point between two adjacent third analog switches equal to the potential at said interconnection points when the input and output terminals of said inverter are short circuited comprises an inverter having its input and output terminals short circuited.

* * * * *

UNITED STATES PATENT AND TRADEMARK OFFICE
CERTIFICATE OF CORRECTION

PATENT NO. : 5,153,454
DATED : October 6, 1992
INVENTOR(S) : Takayuki KOHDAKA

It is certified that error appears in the above-identified patent and that said Letters Patent is hereby corrected as shown below:

Title page,
   item [73], delete "Hammatsu" and insert -- Hamamatsu --.

Signed and Sealed this

Ninth Day of November, 1993

Attest:

Attesting Officer

BRUCE LEHMAN

Commissioner of Patents and Trademarks

UNITED STATES PATENT AND TRADEMARK OFFICE
CERTIFICATE OF CORRECTION

PATENT NO. : 5,153,454
DATED : October 6, 1992
INVENTOR(S) : Takayuki KOHDAKA

It is certified that error appears in the above-identified patent and that said Letters Patent is hereby corrected as shown below:

In column 3, line 43, kindly delete "$T_3$ and $T_2$" and insert -- $V_1$ and $V_2$ --.

Signed and Sealed this

Sixth Day of June, 1995

Attest:

BRUCE LEHMAN

Attesting Officer

Commissioner of Patents and Trademarks